United States Patent
Seki (10) Patent No.: US 10,569,450 B2
(45) Date of Patent: Feb. 25, 2020

(54) IMPRINT APPARATUS, MOLD, IMPRINT METHOD, AND METHOD OF MANUFACTURING ARTICLE

(71) Applicant: CANON KABUSHIKI KAISHA, Tokyo (JP)

(72) Inventor: Junichi Seki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 304 days.

(21) Appl. No.: 15/428,403

(22) Filed: Feb. 9, 2017

(65) Prior Publication Data

US 2017/0248843 A1 Aug. 31, 2017

(30) Foreign Application Priority Data

Feb. 29, 2016 (JP) .................................. 2016-038000

(51) Int. Cl.
*B29C 37/00* (2006.01)
*B29C 59/02* (2006.01)
*G03F 7/00* (2006.01)
*H01L 21/67* (2006.01)

(52) U.S. Cl.
CPC .......... *B29C 37/0003* (2013.01); *B29C 59/02* (2013.01); *G03F 7/0002* (2013.01); *H01L 21/67092* (2013.01)

(58) Field of Classification Search
None
See application file for complete search history.

(56) References Cited

U.S. PATENT DOCUMENTS

| 2009/0246309 A1 | 10/2009 | Washiya et al. |
| 2015/0001749 A1 * | 1/2015 | Arai ...................... G03F 7/0002 264/40.1 |
| 2016/0039126 A1 * | 2/2016 | Tan ........................ G03F 7/0002 264/40.5 |

FOREIGN PATENT DOCUMENTS

| JP | 4542167 B2 | 9/2010 |
| JP | 2014172316 A | 9/2014 |
| JP | 2014183069 A * | 9/2014 |

OTHER PUBLICATIONS

Office Action issued in Japanese Application No. 2016-038000 dated Nov. 1, 2019.

* cited by examiner

*Primary Examiner* — Michael P. Rodriguez
(74) *Attorney, Agent, or Firm* — Rossi, Kimms & McDowell LLP (57) ABSTRACT

The present invention provides an imprint apparatus which performs an imprint process of forming, by using a mold, a pattern of an imprint material on a substrate, including an obtaining unit configured to obtain electric charge information on an amount of first electric charges charged on a first surface of the mold on a side of the substrate by releasing the mold from the cured imprint material on the substrate, a supply unit configured to supply second electric charges having a polarity opposite to that of the first electric charges to an electrode arranged on a second surface of the mold on a side opposite to the first surface, and a control unit configured to control, based on the electric charge information, an amount of the second electric charges supplied from the supply unit to the electrode.

13 Claims, 9 Drawing Sheets

IMPRINT APPARATUS, MOLD, IMPRINT METHOD, AND METHOD OF MANUFACTURING ARTICLE

BACKGROUND OF THE INVENTION

Field of the Invention

The present invention relates to an imprint apparatus, a mold, an imprint method, and a method of manufacturing an article.

Description of the Related Art

An imprint technique is a technique capable of transferring a nanoscale micropattern, and has received attention as one of nanolithography techniques for mass producing semiconductor devices and magnetic storage media. In the imprint apparatus using the imprint technique, a mold (original) on which a fine three-dimensional pattern has been formed is brought into contact with (pressed against) an imprint material on a substrate. Then, the mold is released after the imprint material on the substrate is cured in a state in which the mold and the imprint material are in contact with each other, thereby forming a pattern on the substrate.

In the imprint apparatus, it is necessary, in order to form the pattern, to bring the mold into contact with the imprint material or release the mold from the imprint material. Therefore, the life of the mold is a big issue. One of major factors that influences the life of the mold is particles generated in the imprint apparatus. The particles are attached to the obverse surface of the substrate and the pattern surface of the mold. Therefore, if the mold is brought into contact with the imprint material on the substrate in that state, the pattern of the mold is damaged, or a defect (error) is generated in the pattern formed on the substrate.

As the particles generated in the imprint apparatus, particles arising from sliding or friction caused by operating various actuators such as a stage and a conveying robot are considered. When the imprint material is supplied onto the substrate by an inkjet method, the imprint material which drifts as a mist may be dried and solidified, and then changed to particles. It is also considered that particles weakly attached to the obverse surface of each member at the time of assembling the imprint apparatus are removed from the obverse surface by a slight state change after operating the apparatus.

In particular, as one of mechanisms of attachment of the particles to the mold, there is a phenomenon in which the obverse surface of the mold is charged (charged separately) by releasing the mold from the imprint material on the substrate, and particles attached to the obverse surface of each member near the mold are attracted. For example, on a substrate stage which holds the substrate, various sensors and various marks are arranged, and a flat-plate member for controlling an airflow is further arranged so as to surround the periphery of the substrate. The particles generated in the imprint apparatus are attached to and accumulated on these obverse surfaces. The mold and the substrate stage are always close to each other, and the charged mold generates a strong electric field between itself and the substrate stage. This electric field makes particles that are weakly attached to the substrate stage attracted and attached to the mold.

To cope with this, Japanese Patent No. 4542167 proposes a technique of removing electric charges from a charged mold. Japanese Patent No. 4542167 discloses a technique of arranging a transparent conductive film on the pattern surface of the mold and by connecting this transparent conductive film to ground, removing electric charges generated on the pattern surface of the mold when releasing the mold from an imprint material on a substrate.

However, the technique disclosed in Japanese Patent No. 4542167 is insufficient to reduce attachment of the particles to the mold. For example, immediately after the mold is released from the imprint material on the substrate, electric charges exist in a member such as the imprint material facing the mold, generating an electric field between the member and these electric charges. Therefore, the particles are attracted and attached, in accordance to the polarity thereof, to the mold or the member facing the mold.

Further, the technique disclosed in Japanese Patent No. 4542167 needs the transparent conductive film on the pattern surface of the mold. It becomes necessary, however, to additionally deposit the transparent conductive film on a popular transparent mold (a mold made of quartz) whose processing method is established. This may cause an increase in a manufacturing cost and a decrease in a pattern accuracy. Further, considering application to the manufacture of a semiconductor device, an element present in a conductive film may move to a substrate side as a contamination, leading to a decrease in the electric characteristic of an electronic circuit.

SUMMARY OF THE INVENTION

The present invention provides an imprint apparatus advantageous in reducing attachment of particles to a mold.

According to one aspect of the present invention, there is provided an imprint apparatus which performs an imprint process of forming, by using a mold, a pattern of an imprint material on a substrate, the apparatus including an obtaining unit configured to obtain electric charge information on an amount of first electric charges charged on a first surface of the mold on a side of the substrate by releasing the mold from the cured imprint material on the substrate, a supply unit configured to supply second electric charges having a polarity opposite to that of the first electric charges to an electrode arranged on a second surface of the mold on a side opposite to the first surface, and a control unit configured to control, based on the electric charge information, an amount of the second electric charges supplied from the supply unit to the electrode.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

<First Embodiment>

Figure 1:
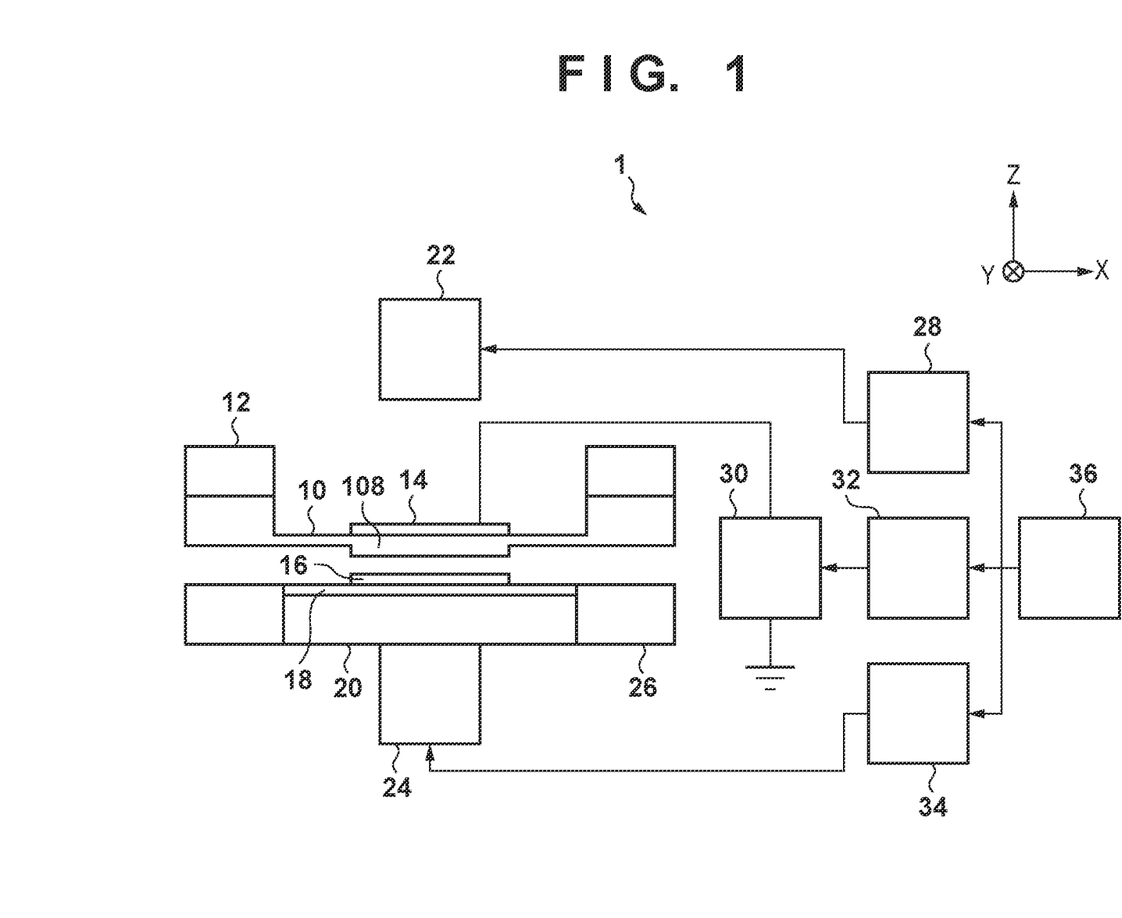
FIG. 1 is a schematic view showing the arrangement of an imprint apparatus according to an aspect of the present invention.

FIG. 1 is a schematic view showing the arrangement of an imprint apparatus 1 according to an aspect of the present invention. The imprint apparatus 1 is a lithography apparatus used in the manufacturing process of a semiconductor device or the like and performs an imprint process of forming, by using a mold, a pattern in an imprint material on a substrate. The imprint apparatus 1 cures the imprint material supplied (applied) to the substrate in a state in which the mold where a pattern has been formed and the imprint material are in contact with each other, and releases the mold from the cured imprint material, thereby transferring the pattern onto the substrate.

As shown in FIG. 1, the imprint apparatus 1 includes a mold chuck 12 which fixes a mold 10, an electrode 14, a substrate chuck 20 which fixes a substrate 18, a curing unit 22, a stage 24, and a plate member 26. The imprint apparatus 1 also includes a curing control unit 28, an electric charge supply unit 30, an electric charge control unit 32, a position control unit 34, and a main control unit 36. In FIG. 1, an X-axis, a Y-axis, and a Z-axis are defined in three-axis directions perpendicular to each other.

The mold 10 and the substrate 18 are arranged so as to face each other while sandwiching an imprint material 16. The mold 10 is an original for molding the imprint material on the substrate. A pattern to be transferred to the imprint material 16 is formed on the mold 10. A metal, silicon (Si), various resins, various types of ceramics, or the like can be used as a material for the mold 10. Note that when a photo-curing resin material is used as the imprint material 16, an optically transparent material such as quartz, sapphire, or a transparent resin is used.

Figure 2A:
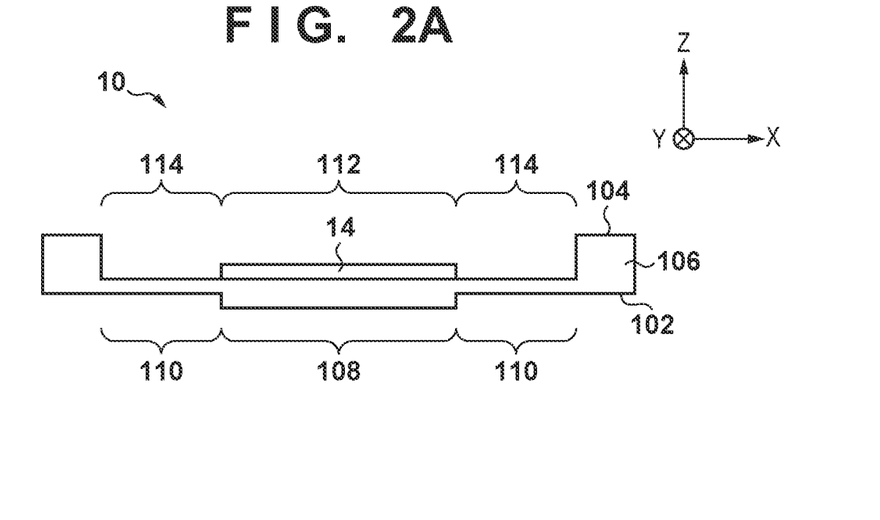
FIGS. 2A and 2B are schematic views showing the arrangement of a mold according to an aspect of the present invention.
Figure 2B:
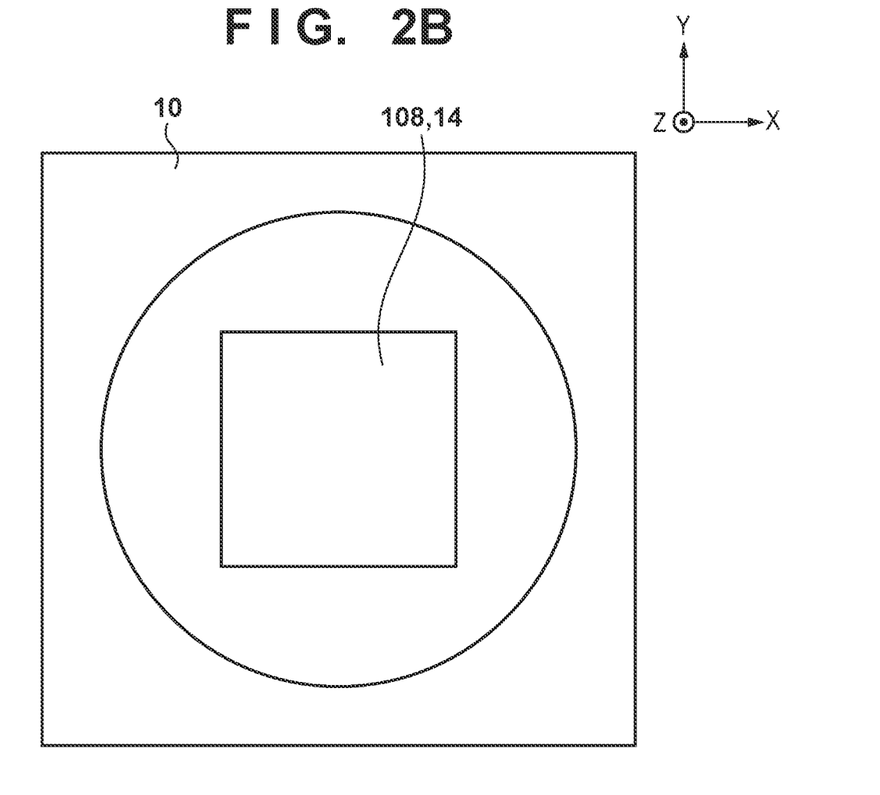

As shown in FIGS. 2A and 2B, the mold 10 is made of a base material 106 having the first surface, that is, an obverse surface 102 on the side of the substrate 18 on which the pattern has been formed and the second surface, that is, a reverse surface 104 on the side opposite to the obverse surface 102. The obverse surface 102 of the mold 10 includes a pattern region (first region) 108 with the pattern and a peripheral region (second region) 110 around the pattern region 108. The pattern region 108 contacts the imprint material 16 on the substrate and in this embodiment, has a convex structure protruding from the peripheral region 110 to the side opposite to the side of the reverse surface 104. This makes it possible, by a surface tension, to let the uncured imprint material 16 less extend off the pattern region 108 when the mold 10 and the imprint material 16 on the substrate are brought into contact with each other. It is therefore possible to define the outer shape of the cured imprint material 16 on the substrate accurately. Note that FIG. 2A is a sectional view showing the mold 10 in a Y-axis direction, and FIG. 2B is a plan view showing the mold 10 in a Z-axis direction.

The electrode 14 is arranged on the reverse surface 104 of the mold 10. The electrode 14 is embodied as, for example, a transparent electrode made of an optically transparent material. The reverse surface 104 of the mold 10 includes a central region (third region) 112 corresponding to a region in which the pattern region 108 is projected on the reverse surface 104 and a peripheral region (fourth region) 114 corresponding to a region in which the peripheral region 110 is projected on the reverse surface 104. The electrode 14 is arranged in a region including at least a part of the central region 112 of the reverse surface 104 of the mold 10. In this embodiment, the electrode 14 has an area equal to that of the central region 112 (pattern region 108) and the same shape as that of the central region 112, and is arranged such that the center of the electrode 14 and the center of the central region 112 match. Therefore, the pattern region 108 and the electrode 14 overlap each other, as shown in FIG. 2B. However, the electrode 14 is not limited to having the area equal to that of the central region 112 and may have, for example, 0.8 to 1.2 times the area, preferably 0.9 to 1.1 times the area. Note that the words "equal" and "same", and the above-described numerical values include a range that can be regarded as equal, including a manufacturing error or the like.

The imprint material 16 is required to have fluidity when filling the pattern of the mold 10 and be in a solid state so as to maintain its shape after an imprint process. For this reason, the photo-curing resin material, a thermosetting resin material, a thermoplastic resin material, or the like is used for the imprint material 16. The photo-curing resin material is particularly suitable for manufacturing the semiconductor device or the like because it does not need a temperature change in a curing process, and changes in the position and shape of the pattern formed on the substrate caused by thermal expansion and contraction of the mold 10, the substrate 18, and the respective members of the imprint apparatus 1 are small.

The imprint material 16 may be supplied (applied) onto the substrate in advance by spin coating, slit coating, screen printing, or the like or may be supplied onto the substrate in the imprint apparatus by using a pneumatic dispenser, a mechanical dispenser, an inkjet dispenser, or the like. Particularly, in the latter case, the supply amount of the imprint material 16 supplied onto the substrate can be adjusted locally in accordance with the pattern density of the mold 10, making it possible to increase the accuracy of the residual film thickness of the imprint material 16 formed on the substrate. Further, the time between supplying the imprint material 16 onto the substrate and bringing the mold 10 into contact with the imprint material 16 can be short, making it possible to reduce a filling time of the imprint material 16 by selecting the high-volatile and low-viscosity imprint material 16. Therefore, this is advantageous in manufacturing the semiconductor device or the like required to have high accuracy and high throughput.

A material for the substrate 18 is selected in accordance to its usage after processing. For example, silicon (Si) for the use as the semiconductor device, quartz, optical glass, or a transparent resin for the use as an optical element, or gallium nitride (GaN) or silicon carbide (SiC) as the use of a light-emitting element is used as the material for the substrate 18.

The curing unit 22 cures the imprint material 16 supplied onto the substrate. The curing unit 22 has an arrangement capable of curing the imprint material 16 in accordance to the type of the imprint material 16. For example, if the imprint material 16 is the photo-curing resin material, the curing unit 22 is configured with a light irradiation mechanism for irradiating the imprint material 16 on the substrate with light, and more specifically, generally irradiates the imprint material 16 with light (UV light) having the wavelength in an ultraviolet region. If the imprint material 16 is the thermosetting resin material, the curing unit 22 is configured with a heating mechanism for heating the imprint material 16 on the substrate. Further, if the imprint material 16 is the thermoplastic resin material, the curing unit 22 is configured with a cooling mechanism for cooling the imprint material 16 on the substrate, but preferably includes a heating mechanism for softening the imprint material 16 at the time of filling. As the cooling mechanism, an active mechanism such as a chiller or a Peltier device is suitable for reducing a time required for the imprint process. However, a passive mechanism such as natural heat radiation may suffice.

The stage 24 moves while holding the substrate 18 via the substrate chuck 20. The plate member 26 called a flush plate which surrounds the periphery of the substrate 18 and the substrate chuck 20 is arranged on the stage 24. The surfaces of the plate member 26 and the substrate 18 on the side of the mold 10 are arranged so as to be almost flush with each other. For example, in an apparatus which moves the substrate 18 at high speed like a semiconductor exposure apparatus, the plate member 26 is widely used in order to stabilize an airflow near the substrate 18.

The curing control unit 28 controls the curing unit 22 under the control of the main control unit 36. The curing control unit 28 cures, at a predetermined timing, the imprint material 16 on the substrate via the curing unit 22 in the state in which the mold 10 and the imprint material 16 are in contact with each other.

The electric charge control unit 32 controls the electric charge supply unit 30 under the control of the main control unit 36. The electric charge control unit 32 controls (adjusts), via the electric charge supply unit 30, the amount of electric charges to be supplied to the electrode 14 arranged on the reverse surface 104 of the mold 10. The electric charge control unit 32 also functions as an obtaining unit which obtains electric charge information to be described later. For example, the electric charge supply unit 30 includes at least one of a voltage source which applies a voltage and a current source which applies a current to the electrode 14, and can appropriately select a method capable of supplying the electric charges to the electrode 14.

The position control unit 34 controls the stage 24 under the control of the main control unit 36. The position control unit 34 controls (adjusts), via the stage 24, the relative positions of the mold 10 and the substrate 18.

The main control unit 36 controls the whole (operation) of the imprint apparatus 1 via the curing control unit 28, the electric charge control unit 32, the position control unit 34, and the like. The main control unit 36 controls the respective units of the imprint apparatus 1 to perform the imprint process.

The arrangement of the imprint apparatus 1 is not limited to the arrangement shown in each of FIG. 1 and FIGS. 2A and 2B as long as it satisfies the above-described function. The imprint apparatus 1 may be configured to, for example, move not the substrate 18 but the mold 10 or both the substrate 18 and the mold 10. The curing unit 22 may be arranged not on the side of the mold 10 but on the side of the substrate 18. When the imprint material 16 is made of the photo-curing resin material, the curing unit 22 has to be arranged on the side of the substrate 18 if the material for the mold 10 is an opaque material such as Si, and the material for the substrate 18 is a transparent material such as quartz.

Figure 3A:
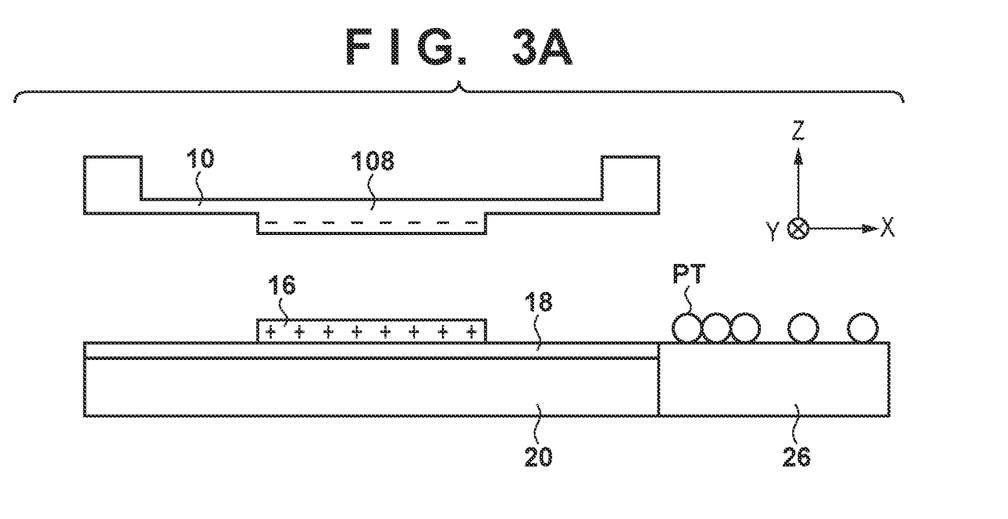
FIGS. 3A to 3C are views for explaining states after mold release in a general imprint apparatus.

A state after the mold 10 is released (after mold release) from the cured imprint material 16 on the substrate in a general imprint apparatus not having the electrode 14, the electric charge supply unit 30, and the electric charge control unit 32 will now be described with reference to FIGS. 3A to 3C. If the mold 10 is released (separated) from the cured imprint material 16 on the substrate, on the mold 10, the pattern region 108 in contact with the imprint material 16 on the substrate has electric charges (is charged) by separating charge, as shown in FIG. 3A. It is known that the polarity of the electric charges charged in the pattern region 108 is uniquely decided by the combination of the material for the mold 10 and the material for the imprint material 16. This combination is often shown in FIG. 3A generally called a triboelectric series. Here, the polarity of the electric charges charged in the pattern region 108 is negative and is indicated by − (minus) signs in FIG. 3A.

Figure 3B:
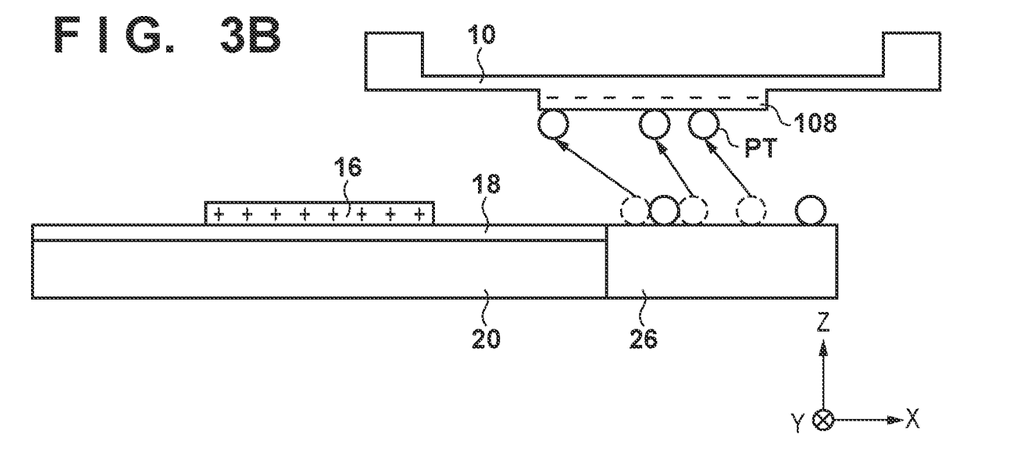
Figure 3C:
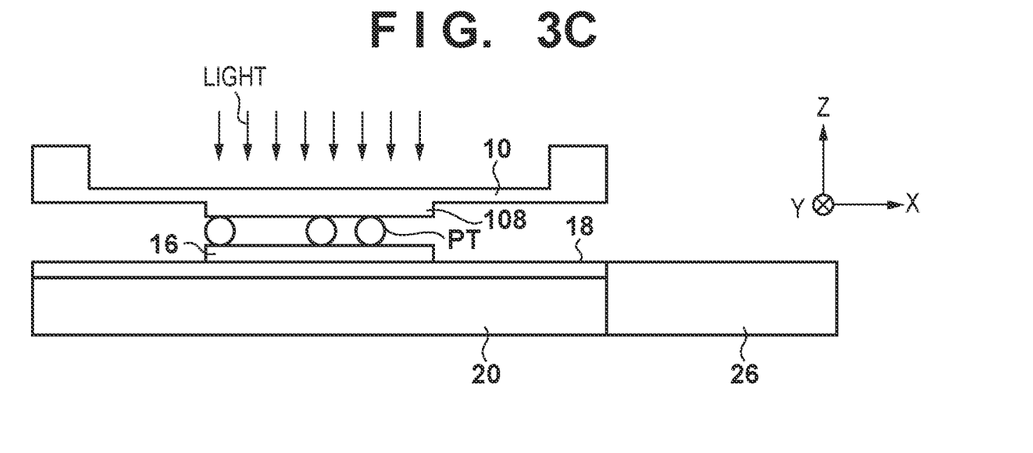

In a state in which the pattern region 108 is charged, particles PT accumulated on the plate member 26 are attracted to the electric charges of the pattern region 108 by an electrostatic force and attached to the pattern region 108 when the mold 10 faces the plate member 26, as shown in FIG. 3B. If the next imprint process is performed in this state, the particles PT are sandwiched between the imprint material 16 and the pattern region 108 of the mold 10 as shown in FIG. 3C, causing a pattern defect. There is also a case in which the mold 10 is damaged. In such a case, the pattern defect is generated repeatedly by the following imprint process unless the mold 10 is changed.

Figure 4A:
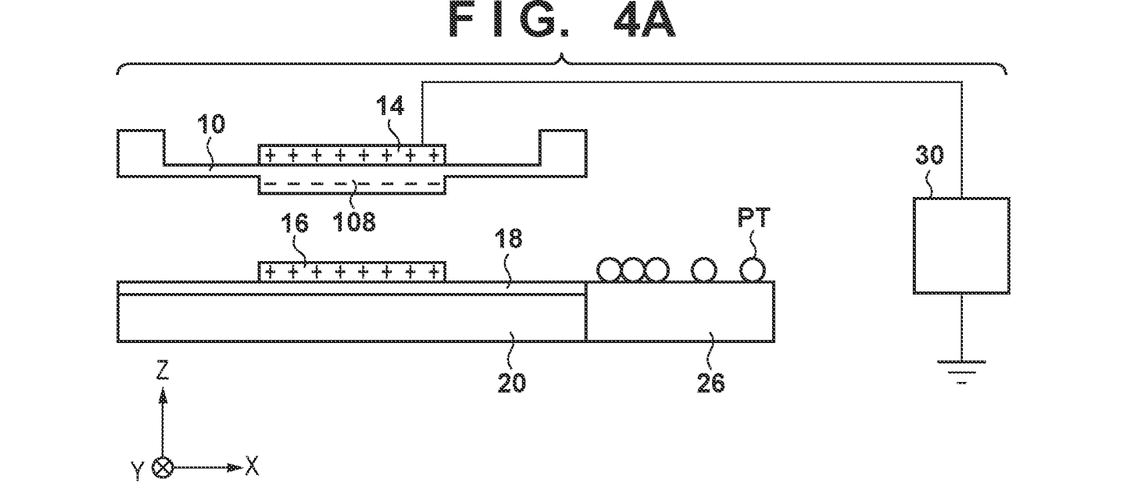
FIGS. 4A to 4C are views for explaining states after mold release in the imprint apparatus shown in FIG. 1.

To cope with this, in this embodiment, electric charges (second electric charges) having a polarity opposite to that of the electric charges (first electric charges) in the pattern region 108 are supplied from the electric charge supply unit 30 to the electrode 14 arranged on the reverse surface 104 of the mold 10, as shown in FIG. 4A. More specifically, positive electric charges are supplied from the electric charge supply unit 30 to the electrode 14 such that an electric charge amount on the reverse surface 104 of the mold 10 becomes equal to that on the obverse surface 102 of the mold 10. In the drawings, the positive electric charges are indicated by + (plus) signs.

Figure 5A:
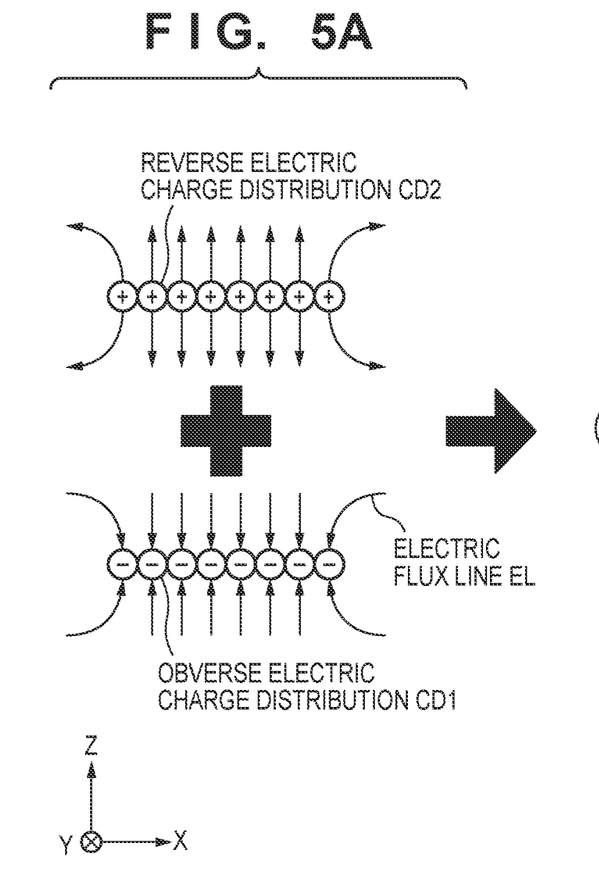
FIGS. 5A and 5B are views for explaining an operation principle of the present invention.
Figure 5B:
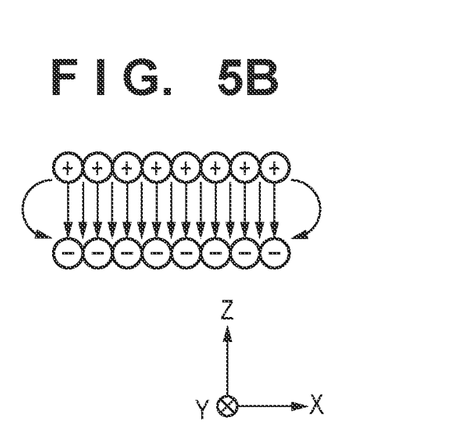

An operation principle of the present invention will be described with reference to FIGS. 5A and 5B. As shown in FIG. 5A, letting an obverse electric charge distribution CD1 be the electric charges in the pattern region 108 of the mold 10 and a reverse electric charge distribution CD2 be the electric charges in the electrode 14, they are distributed on respective planes. If each of the obverse electric charge distribution CD1 and the reverse electric charge distribution CD2 exists independently, electric fields arising from each of them are generated as indicated by electric flux lines EL. Note that if these electric charge distributions are close to and face each other, the electric fields generated by the respective distributions are simply added. This is called the principle of electric field superposition. In particular, as shown in FIG. 5B, when the obverse electric charge distribution CD1 and the reverse electric charge distribution CD2 are relative to each other in parallel, and in a mirror-image relationship when viewed from the centers of both, the electric fields generated by them almost cancel each other. As a result, the electric flux lines EL hardly leak outside except for end portions. It is therefore possible to obtain almost the same effect as in a case in which the electric charges in the pattern region 108 of the mold 10 are removed. To achieve this, the pattern region 108 and the electrode 14 are preferably provided in regions corresponding to the obverse and reserve surfaces of the mold 10.

Referring back to FIG. 4B, in this embodiment, the mold 10 faces the plate member 26 in a state in which the electric charges having the polarity opposite to that of the electric charges in the pattern region 108 of the mold 10 are supplied from the electric charge supply unit 30 to the electrode 14. As described above, the electric field generated by the electric charges in the pattern region 108 is canceled by the electric field generated by the electric charges in the electrode 14. It is therefore possible to greatly reduce attachment (attraction) of the particles PT accumulated on the plate member 26 to the pattern region 108.

Figure 4B:
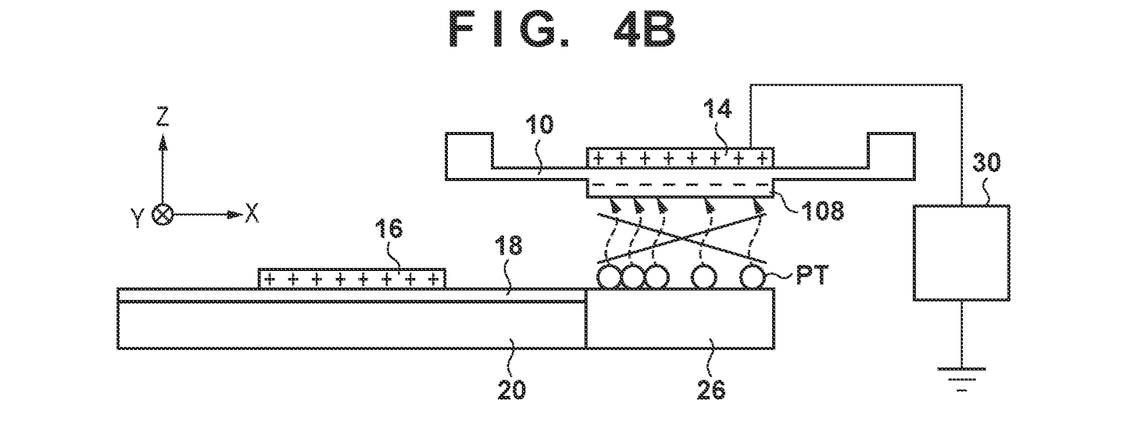
Figure 4C:
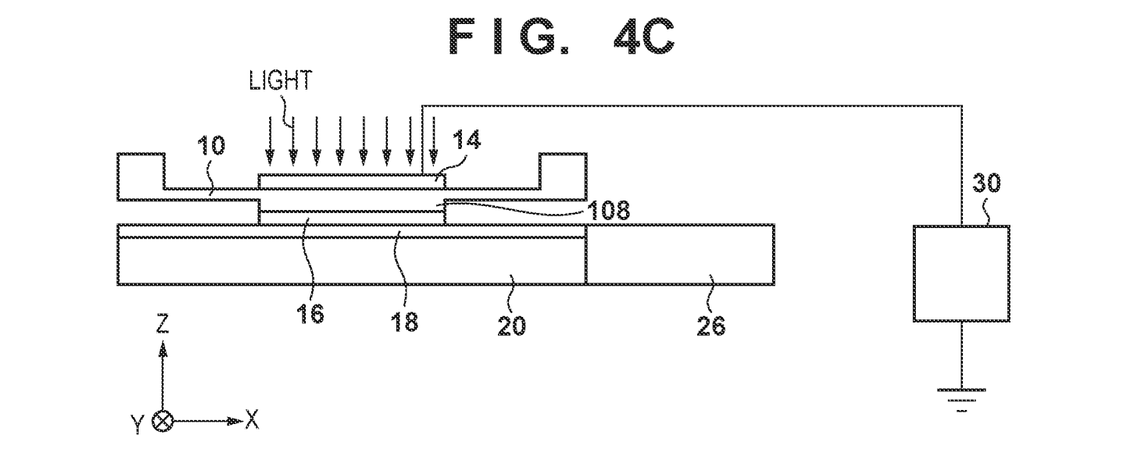

FIG. 4C shows a state in which the next imprint process is performed from the state shown in FIG. 4B. Attachment of the particles PT to the pattern region 108 of the mold 10 is reduced greatly and so is the probability that the particles PT are sandwiched between the pattern region 108 and the imprint material 16. It is therefore possible to greatly reduce the defect in the pattern formed on the substrate and damage to the mold 10.

As in this embodiment, an influence (attachment of the particles) brought about by charging in the mold 10 (pattern region 108) can be reduced in a short time by electrically supplying the electric charges to the electrode 14 arranged on the reverse surface 104 of the mold 10. A material for the obverse surface 102 of the mold 10, and more specifically, the pattern region 108 can be selected freely. It is therefore possible, as compared with a technique of forming a conductive film on a mold, to make a pattern more easily, and further suppress an increase in a manufacturing cost and a decrease in a pattern accuracy.

The imprint process in this embodiment, and more specifically, the amount of the electric charges (electric charge amount) supplied from the electric charge supply unit 30 to the electrode 14 will be described below in detail. Note that the mold 10 is made of synthetic quartz, the imprint material 16 is made of the photo-curing resin material, and the substrate 18 is made of a silicon wafer. The curing unit 22 irradiates the imprint material 16 on the substrate with UV light. The electric charge supply unit 30 includes the voltage source. The electric charge control unit 32 controls (adjusts) the voltage value of the voltage source such that the electric charges of a predetermined amount are supplied to the electrode 14.

On the obverse surface 102 of the mold 10, the 30 mm$^2$ pattern region 108 is formed as a convex portion of height 0.1 mm with respect to the peripheral region 110. The thickness of the mold 10 in the pattern region 108 is 1 mm. On the reverse surface 104 of the mold 10, and more specifically, in the central region 112, the 30 mm$^2$ electrode 14 made of an ITO (Indium Tin Oxide) film of thickness 1 µm is arranged so as to overlap the entire surface of the pattern region 108. A pattern formed by a three-dimensional fine structure is formed on the entire surface of the pattern region 108. The dimensions of this pattern are 50 nm wide by 100 nm deep on average.

In this arrangement, if the mold 10 is released from the cured imprint material 16 on the substrate, electric charges of $-3.4 \times 10^{-8}$ [C] are charged in the pattern region 108. It is confirmed that the amount of the electric charges charged in the pattern region 108 by releasing the mold 10 from the cured imprint material 16 on the substrate is measured in advance, and the electric charges are stable with $-3.4 \times 10^{-8}$ [C] even if the imprint process is repeated. Note that information on the amount of the electric charges charged in the pattern region 108 is stored, as electric charge information, in, for example, the storage unit of the imprint apparatus 1 such as a memory of the main control unit 36.

Therefore, based on the electric charge information stored in the storage unit, the electric charges of $+3.4 \times 10^{-8}$ [C] are supplied from the electric charge supply unit 30 to the electrode 14. Consequently, in the mold 10, the electric field generated by the electric charges in the pattern region 108 and the electric field generated by the electric charges in the electrode 14 cancel each other.

Next, the substrate 18 is retracted (moved) from below the mold 10 in a state in which the electric charges are supplied from the electric charge supply unit 30 to the electrode 14 (refer to FIG. 4B), and then the imprint material 16 is supplied to another region on the substrate. At this time, the pattern region 108 of the mold 10 and the plate member 26 become close to and face each other. As described above, however, the electric field generated by the electric charges in the pattern region 108 is canceled by the electric field generated by the electric charges in the electrode 14, reducing attachment of the particles PT to the pattern region 108.

Next, the pattern region 108 of the mold 10 and the imprint material 16 supplied to the other region on the substrate are brought into contact with each other. Then, the imprint material 16 is irradiated with the UV light in a state in which the pattern region 108 and the imprint material 16 are in contact with each other, and is cured (refer to FIG. 4C), releasing the mold 10 from the cured imprint material 16.

If the pattern of the imprint material 16 thus formed on the substrate is inspected by a defect inspection apparatus, it is confirmed that the number of defects in the imprint material 16 formed on the substrate is decreased by 27% as compared with a case in which no electric charge is supplied to the electrode 14.

In this embodiment, the amount of the electric charges charged on the obverse surface 102, that is, the pattern region 108 of the mold 10 by releasing the mold 10 from the cured imprint material 16 on the substrate is measured in advance, and that measurement result is stored, as the electric charge information, in the storage unit of the imprint apparatus 1. Note that the electric charge information may be stored in the storage unit as profile information indicating the relationship between a time and the amount of electric charges to be supplied to the reverse surface 104 of the mold 10 obtained from the amount of the electric charges charged on the obverse surface 102 of the mold 10. Then, the electric charge control unit 32 obtains the electric charge information stored in the storage unit and based on that electric charge information, controls the amount of the electric charges supplied from the electric charge supply unit 30 to the electrode 14 arranged on the reverse surface 104, that is, the central region 112 of the mold 10. At this time, the electric charge control unit 32 controls the amount of the electric charges supplied to the electrode 14 such that they become equal in amount and opposite in polarity to the electric charges charged in the pattern region 108 of the mold 10. Note that the imprint apparatus 1 may include, as an obtaining unit which obtains the electric charge information, a measurement unit which measures the amount of the electric charges charged in the pattern region 108 of the mold 10. Such an arrangement is particularly advantageous in a case in which the amount of the electric charges charged in the pattern region 108 of the mold 10 is not stable at the time of mold release or in a case in which the amount of the electric charges to be supplied to the electrode 14 is changed frequently.

<Second Embodiment>

Figure 6A:
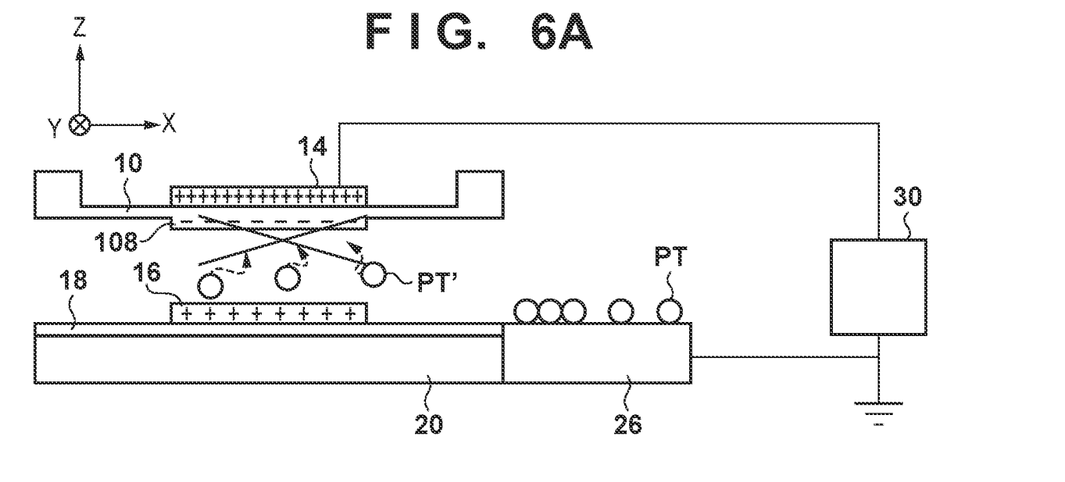
FIGS. 6A to 6C are views for explaining states after mold release in the imprint apparatus shown in FIG. 1.

The second embodiment will be described with reference to FIGS. 6A to 6C. FIG. 6A shows a state after mold release.

As shown in FIG. 6A, in a state in which a mold 10 and an imprint material 16 on a substrate face each other, the imprint material 16 is charged separately with a polarity opposite to that of electric charges in a pattern region 108 and the same electric charge amount as in the pattern region 108. Therefore, even if an electric field by the electric charges in the pattern region 108 is canceled by supplying electric charges to an electrode 14, an electric field by electric charges in the imprint material 16 remains between the pattern region 108 and the imprint material 16.

On the other hand, depending on the pattern or release condition of the mold 10, the intensity of a material for the imprint material 16, or the like, a part of the imprint material 16 on the substrate may be separated from a substrate 18 at the time of mold release and become particles PT'. These particles PT' are charged (charged separately) equal in polarity to the electric charges in the imprint material 16 on the substrate. Consequently, a repulsive force is generated between the particles PT' and the imprint material 16 on the substrate, and the particles PT' are attached to the mold 10 (the pattern region 108 thereof).

In this case, it is apparently advantageous to charge the mold 10 equal in polarity to the electric charges in the imprint material 16 on the substrate. Therefore, in this embodiment, electric charges opposite in polarity to and larger in amount than the electric charges in the pattern region 108 are supplied to the electrode 14 arranged on a reverse surface 104 of the mold 10, as shown in FIG. 6A. In other words, the amount of the electric charges supplied from an electric charge supply unit 30 to the electrode 14 is controlled so as to cancel the electric field by the electric charges in the imprint material 16 (electric charges on a member facing the pattern region 108) in a space between the pattern region 108 and the imprint material 16. At this time, if an apparent electric charge amount of the mold 10 is too large as a whole, the mold 10 actively attracts particles charged with the polarity opposite to that of the electric charges in the imprint material 16 on the substrate when those particles exist. In this embodiment, the mold 10 and the imprint material 16 on the substrate are apparently caused to have the equal electric charge amount from the viewpoint of generating, in the mold 10, a repulsive force equal to that in the imprint material 16 on the substrate. It is therefore preferable that the amount of the electric charges supplied from the electric charge supply unit 30 to the electrode 14 is controlled such that the electric charge amount on the reverse surface 104 of the mold 10 doubles that on an obverse surface 102 of the mold 10. However, this is merely an example. The amount of the electric charges to be supplied from the electric charge supply unit 30 to the electrode 14 depends on the ratio at which the particles PT' arising from the imprint material 16 on the substrate exist.

An imprint process in this embodiment, and more specifically, the amount of the electric charges (electric charge amount) supplied from the electric charge supply unit 30 to the electrode 14 will be described below in detail. For example, when electric charges of $-3.4 \times 10^{-8}$ [C] are charged in the pattern region 108 of the mold 10 at the time of mold release, electric charges of $+6.8 \times 10^{-8}$ [C] are supplied from the electric charge supply unit 30 to the electrode 14, as shown in FIG. 6A.

Figure 6B:
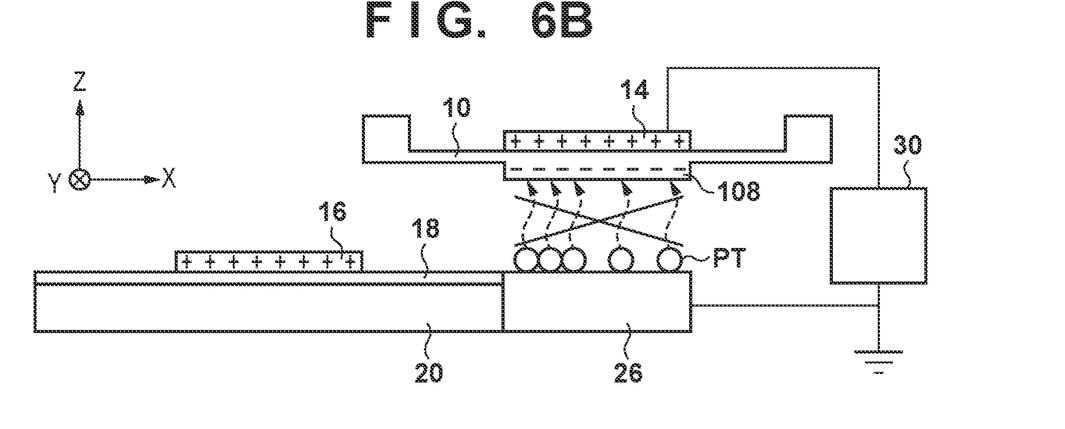

Next, the substrate 18 is retracted (moved) from below the mold 10 in a state in which the electric charges are supplied from the electric charge supply unit 30 to the electrode 14, and then the imprint material 16 is supplied to another region on the substrate, as shown in FIG. 6B. Note that in a state in which the mold 10 (pattern region 108) does not face the substrate 18 (the imprint material 16 on the substrate), the electric charge amount on the reverse surface 104 of the mold 10 and the electric charge amount on the obverse surface 102 of the mold 10 are made equal to each other to cancel mutual electric fields. This is for reducing attachment of particles PT accumulated on a plate member 26 to the pattern region 108 of the mold 10 when the mold 10 (pattern region 108) and the plate member 26 are close to and face each other. Therefore, the amount of the electric charges supplied from the electric charge supply unit 30 to the electrode 14 is decreased, and the electric charges of $+3.4 \times 10^{-8}$ [C] are supplied to the electrode 14. As described above, when a transition is made from a state in which the mold 10 and the substrate 18 face each other to a state in which the mold 10 and the substrate 18 does not face each other, the amount of the electric charges supplied to the electrode 14 is changed such that the electric charge amount on the reverse surface 104 of the mold 10 becomes equal to that on the obverse surface 102.

Figure 6C:
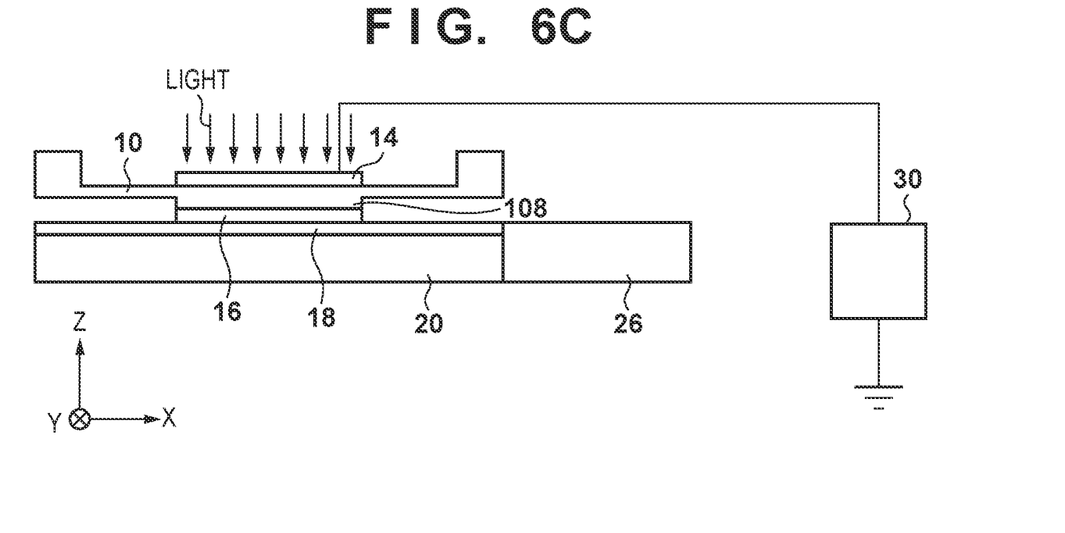

Next, the pattern region 108 of the mold 10 and the imprint material 16 supplied to the other region on the substrate are brought into contact with each other, as shown in FIG. 6C. Then, the imprint material 16 is irradiated with UV light in a state in which the pattern region 108 and the imprint material 16 are in contact with each other, and is cured, releasing the mold 10 from the cured imprint material 16.

If the pattern of the imprint material 16 thus formed on the substrate is inspected by a defect inspection apparatus, it is confirmed that the number of defects in the imprint material 16 formed on the substrate is decreased by 31% as compared with a case in which no electric charge is supplied to the electrode 14.

In this embodiment, the amount of the electric charges supplied from the electric charge supply unit 30 to the electrode 14 is controlled (adjusted) in accordance with the relative positions of the mold 10 (pattern region 108) and the substrate 18 (the imprint material 16 on the substrate). However, the present invention is not limited to this. For example, it is advantageous to change the amount of the electric charges supplied to the electrode 14 also in a case in which the plate member 26 is charged, in a case in which the amount of the electric charges charged in the pattern region 108 of the mold 10 changes in accordance with the number of imprint processes, or the like. It is therefore preferable that the amount of the electric charges supplied to the electrode 14 is controlled based on at least one of the relative positional relationship between the mold 10 and the substrate 18, a charged state in the plate member 26, and the number of imprint processes performed.

<Third Embodiment>

Figure 7:
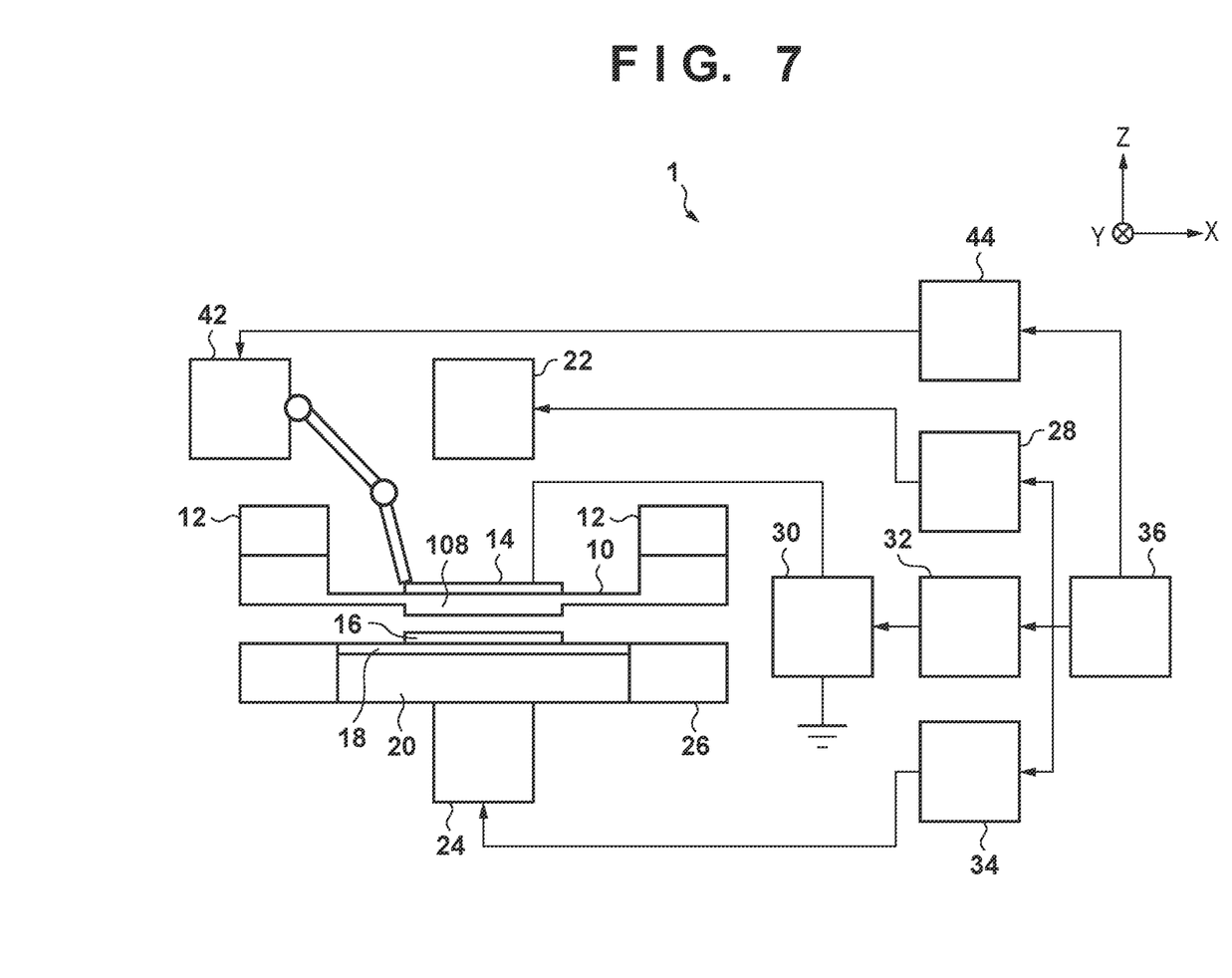
FIG. 7 is a schematic view showing the arrangement of an imprint apparatus according to an aspect of the present invention.

The third embodiment will be described with reference to FIGS. 7, 8A to 8C, and 9. FIG. 7 is a schematic view showing another arrangement of an imprint apparatus 1 according to an aspect of the present invention. In this embodiment, an electrode 14 is formed by a metal plate having a thickness of 0.1 mm and made of SUS303. The electrode 14 is not a transparent electrode, does not transmit through light irradiating an imprint material 16 on a substrate from a curing unit 22, and is thus arranged detachably (as a separate member) with respect to a reverse surface 104 of a mold 10. In a state in which the electrode 14 is arranged on the reverse surface 104 of the mold 10, the positional relationship between the electrode 14 and a pattern region 108 of the mold 10 is the same as in the first embodiment (refer to FIGS. 2A and 2B).

The imprint apparatus 1 further includes a detachable unit 42 and an electrode control unit 44. For example, the detachable unit 42 is formed by a robot arm capable of conveying the electrode 14 and attaches/detaches the electrode 14 to/from the reverse surface 104 of the mold 10. The electrode control unit 44 controls the detachable unit 42 under the control of a main control unit 36. For example, the electrode control unit 44 retracts the electrode 14 from the reverse surface 104 of the mold 10 via the detachable unit 42 before the imprint material 16 on the substrate is irradiated with UV light from the curing unit 22.

Figure 9:
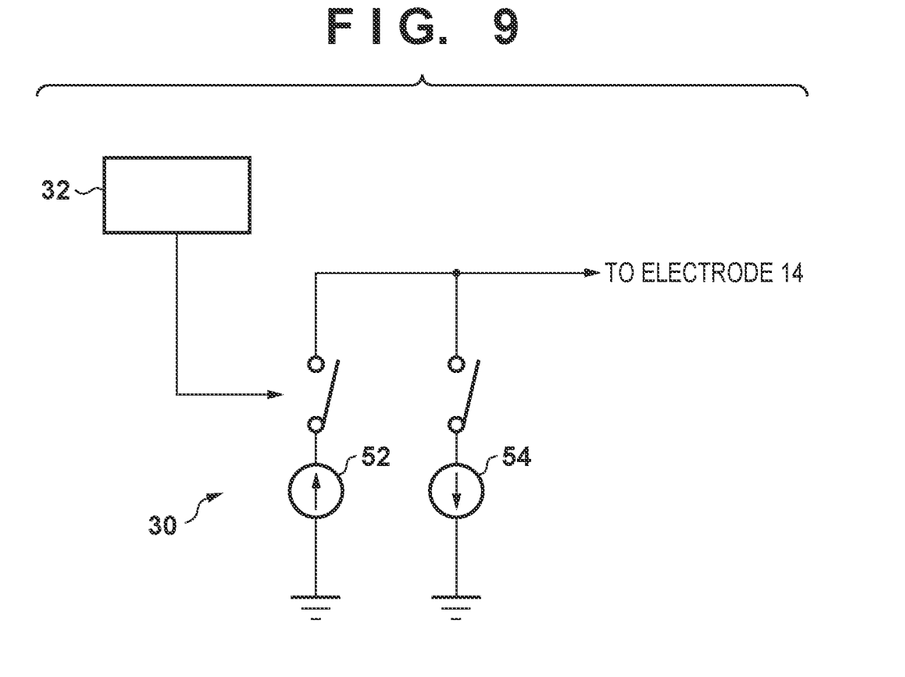
FIG. 9 is a schematic view showing an example of the arrangement of an electric charge supply unit in the imprint apparatus.

In this embodiment, an electric charge supply unit 30 includes a first current source 52 and a second current source 54 different in direction of a current supplied to the electrode 14, as shown in FIG. 9. An electric charge control unit 32 controls the integrated value of the amount of the current supplied to the electrode 14 such that electric charges of a predetermined amount are supplied to the electrode 14 arranged on the reverse surface 104 of the mold 10. More specifically, the electric charge control unit 32 includes a timer, and monitors a time in which the current is supplied from the first current source 52 or the second current source 54 to the electrode 14 to control ON/OFF of a switch provided between the electrode 14 and each of the first current source 52 and the second current source 54. The electric charge control unit 32 also controls switching of a current source which supplies the current to the electrode 14 between the first current source 52 and the second current source 54.

Figure 8A:
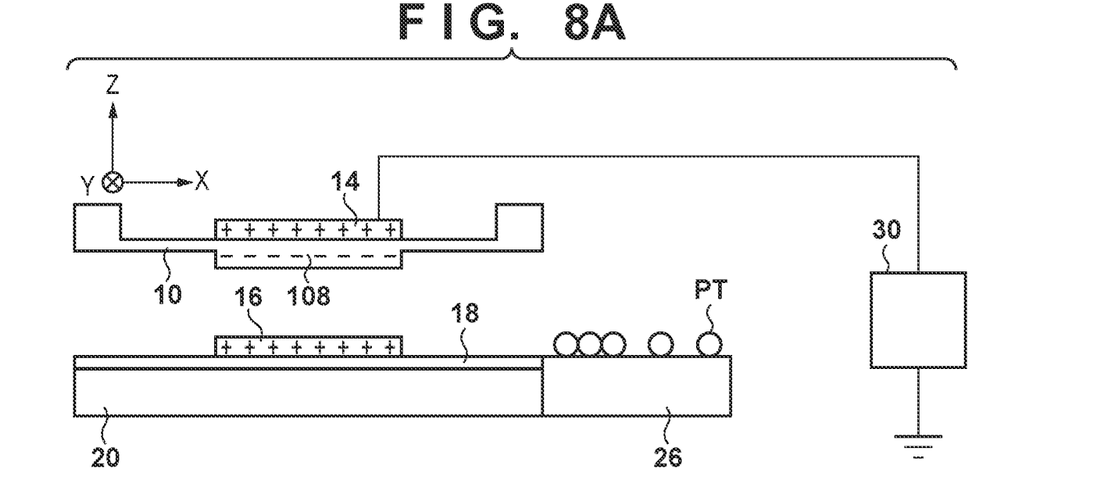
FIGS. 8A to 8C are views for explaining states after mold release in an imprint apparatus shown in FIG. 7.

An imprint process in this embodiment, and more specifically, the amount of the electric charges (electric charge amount) supplied from the electric charge supply unit 30 to the electrode 14 will be described below in detail. FIG. 8A shows a state after mold release. In this embodiment, if the mold 10 is released from the cured imprint material 16 on the substrate, electric charges of $-2.7 \times 10^{-8}$ [C] are charged in the pattern region 108. It is confirmed that the electric charge amount is measured in advance, and the electric charges are stable with $-2.7 \times 10^{-8}$ [C] even if the imprint process is repeated. Therefore, electric charges of $+2.7 \times 10^{-8}$ [C] are supplied from the electric charge supply unit 30 to the electrode 14.

Figure 8B:
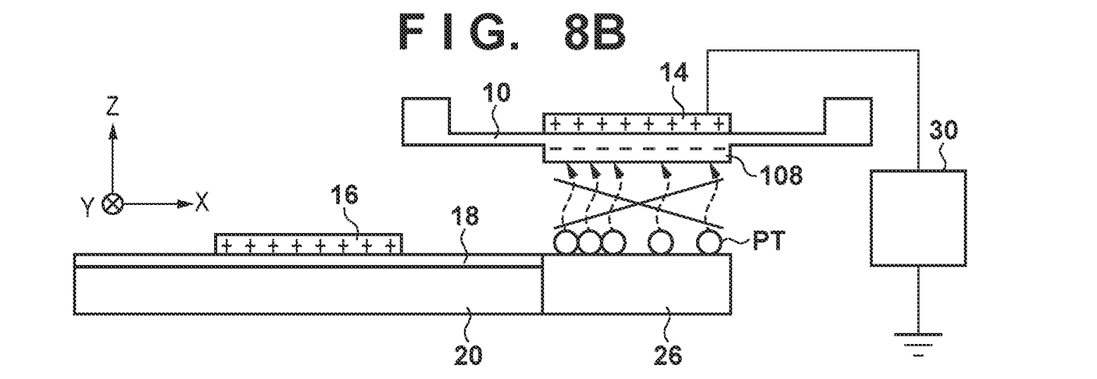

Next, as shown in FIG. 8B, a substrate 18 is retracted (moved) from below the mold 10 in a state in which the electric charges are supplied from the electric charge supply unit 30 to the electrode 14, changing the substrate 18. At this time, the pattern region 108 of the mold 10 and the plate member 26 become close to and face each other. The imprint material 16 is supplied to a region of the new substrate 18 held by a substrate chuck 20, in which the imprint process is to be performed.

Figure 8C:
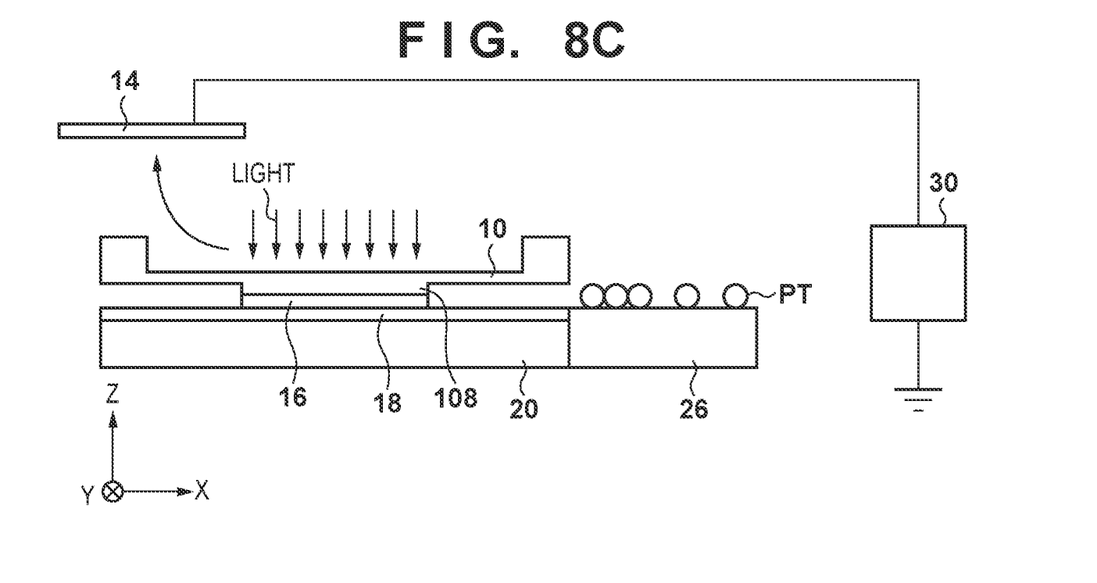

Next, as shown in FIG. 8C, the electrode 14 is retracted from the reverse surface 104 of the mold 10 via the detachable unit 42, bringing the pattern region 108 of the mold 10 and the imprint material 16 supplied onto the new substrate into contact with each other. Then, the imprint material 16 is irradiated with UV light in a state in which the pattern region 108 and the imprint material 16 are in contact with each other, and is cured, releasing the mold 10 from the cured imprint material 16.

If the pattern of the imprint material 16 thus formed on the substrate is inspected by a defect inspection apparatus, it is confirmed that the number of defects in the imprint material 16 formed on the substrate is decreased by 26% as compared with a case in which no electric charge is supplied to the electrode 14.

In this embodiment, when the imprint material 16 on the substrate is cured, the opaque electrode 14 is retracted from the reverse surface 104 of the mold 10 in order to irradiate the imprint material 16 with the UV light (that is, transmit through the UV light). However, retracting the electrode 14 from the reverse surface 104 of the mold 10 is also effective in a case in which alignment measurement is performed via the mold 10, a case in which the state (for example, the filling state) of the imprint material 16 on the substrate is observed, or the like.

In this embodiment, the imprint apparatus 1 needs additional units such as the detachable unit 42 and the electrode control unit 44. However, the electrode 14 need not be provided on the reverse surface 104 of the mold 10. Therefore, this embodiment is advantageous in reducing a total cost in a case in which, for example, the imprint process is performed while changing the variety of molds 10.

<Fourth Embodiment>

A manufacturing method of a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus 1. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is superior to a conventional method in at least one of the performance, quality, productivity, and production cost of the article.

The present invention is also applicable not only to the imprint apparatus but also to an exposure apparatus which transfers the pattern of an original such as a reticle or a mask to the substrate via a projection optical system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-038000 filed on Feb. 29, 2016, which is hereby incorporated by reference herein in its entirety.

What is claimed is:

1. An imprint apparatus which performs an imprint process of forming, by using a mold, a pattern of an imprint material on a substrate, the apparatus comprising:
    an obtaining unit configured to obtain electric charge information on an amount of first electric charges charged on a first surface of the mold by releasing the mold from the cured imprint material on the substrate, wherein the first surface of the mold is a surface on which a pattern is formed;
    a supply unit configured to supply second electric charges having a polarity opposite to that of the first electric charges to an electrode arranged on a second surface of the mold on a side opposite to the first surface; and
    a control unit configured to control, based on the electric charge information, an amount of the second electric charges supplied from the supply unit to the electrode.

2. The apparatus according to claim 1, wherein the electrode has an area equal to that of a pattern region including the pattern formed on the first surface of the mold, and is arranged on the second surface so as to overlap a region in which the pattern region is projected on the second surface.

3. The apparatus according to claim 1, wherein the control unit controls the amount of the second electric charges supplied from the supply unit to the electrode so as to generate an electric field in a direction in which an electric field generated by the first electric charges is canceled on a space between the mold and the substrate.

4. The apparatus according to claim 1, wherein the control unit controls the amount of the second electric charges supplied from the supply unit to the electrode such that the amount of the second electric charges on the second surface becomes equal to the amount of the first electric charges on the first surface.

5. The apparatus according to claim 1, wherein the control unit controls the amount of the second electric charges supplied from the supply unit to the electrode so as to generate an electric field in a direction in which an electric field generated by electric charges on a member facing on the mold across a space between the mold and the substrate is canceled.

6. The apparatus according to claim 1, wherein the control unit controls the amount of the second electric charges supplied from the supply unit to the electrode such that the amount of the second electric charges on the second surface doubles the amount of the first electric charges on the first surface.

7. The apparatus according to claim 5, wherein while a transition is made from a state in which the mold and the substrate face each other to a state in which the mold and the substrate does not face each other, the control unit controls the amount of the second electric charges supplied from the supply unit to the electrode such that the amount of the second electric charges on the second surface becomes equal to the amount of the first electric charges on the first surface.

8. The apparatus according to claim 1, wherein the electric charge information contains profile information indicating a relationship between a time and the amount of the second electric charges to be supplied to the second surface obtained from the amount of the first electric charges charged on the first surface.

9. The apparatus according to claim 1, wherein based on at least one of a relative positional relationship between the mold and the substrate, a charged state in a plate member arranged so as to surround a periphery of the substrate, and the number of imprint processes performed, the control unit controls the amount of the second electric charges supplied from the supply unit to the electrode.

10. The apparatus according to claim 1, wherein the supply unit includes a voltage source configured to apply a voltage, a current source configured to apply a current to the electrode arranged on the second surface of the mold, or the voltage source and the current source.

11. The apparatus according to claim 1, further comprising a detachable unit configured to attach the electrode to the second surface of the mold and detach the electrode from the second surface of the mold.

12. The apparatus according to claim 1, wherein the obtaining unit includes a measurement unit configured to measure the amount of the first electric charges charged on the first surface.

13. The apparatus according to claim 1, further comprising a storage unit configured to store the electric charge information,
wherein the obtaining unit obtains the electric charge information stored in the storage unit.

* * * * *